United States Patent
Sun et al.

(10) Patent No.: US 10,564,772 B2
(45) Date of Patent: Feb. 18, 2020

(54) ARRAY SUBSTRATE, ITS DRIVING METHOD AND MANUFACTURING METHOD, AND DISPLAY DEVICE

(71) Applicants: BOE TECHNOLOGY GROUP CO., LTD., Beijing (CN); ORDOS YUANSHENG OPTOELECTRONICS CO., LTD., Ordos (CN)

(72) Inventors: Chaochao Sun, Beijing (CN); Huafeng Liu, Beijing (CN); Shengwei Zhao, Beijing (CN); Kai Zhang, Beijing (CN); Lei Yang, Beijing (CN); Lulu Ye, Beijing (CN); Jingping Lv, Beijing (CN); Chao Wang, Beijing (CN); Chongliang Hu, Beijing (CN); Meng Yang, Beijing (CN); Duolong Ding, Beijing (CN); Bule Shun, Beijing (CN); Lin Xie, Beijing (CN); Yao Li, Beijing (CN); Shimin Sun, Beijing (CN)

(73) Assignees: BOE TECHNOLOGY GROUP CO., LTD., Beijing (CN); ORDOS YUANSHENG OPTOELECTRONICS CO., LTD., Beijing (CN)

(*) Notice: Subject to any disclaimer, the term of this patent is extended or adjusted under 35 U.S.C. 154(b) by 0 days.

(21) Appl. No.: 15/233,408

(22) Filed: Aug. 10, 2016

(65) Prior Publication Data
US 2017/0205953 A1 Jul. 20, 2017

(30) Foreign Application Priority Data

Jan. 14, 2016 (CN) .......................... 2016 1 0025575

(51) Int. Cl.
*G06F 3/041* (2006.01)
*G09G 3/36* (2006.01)
(Continued)

(52) U.S. Cl.
CPC ........ *G06F 3/0418* (2013.01); *G02F 1/13338* (2013.01); *G02F 1/136204* (2013.01);
(Continued)

(58) Field of Classification Search
CPC ......... G02F 1/136204; G02F 1/136213; G02F 1/13338; G02F 1/136227;
(Continued)

(56) References Cited

U.S. PATENT DOCUMENTS 8,427,435 B2* 4/2013 Takahashi ............... G06F 3/044
345/173
8,970,532 B2* 3/2015 Kim .................... H01L 27/1259
345/173
(Continued)

FOREIGN PATENT DOCUMENTS

CN 103926760 A 7/2014
CN 104330935 A 2/2015
(Continued)

OTHER PUBLICATIONS

First Chinese Office Action regarding Application No. 201610025575.8 dated May 3, 2018. Translation provided by Dragon Intellectual Property Law Firm.
(Continued)

*Primary Examiner* — Michael J Jansen, II
(74) *Attorney, Agent, or Firm* — Harness, Dickey & Pierce, P.L.C.

(57) ABSTRACT

The present disclosure provides an array substrate, its driving method and manufacturing method, and a display device. The array substrate includes a transistor layer
(Continued)

arranged on a base, and a first transparent conductive layer, a first insulation layer, a second transparent conductive layer, a second insulation layer and a third transparent conductive layer sequentially arranged on the transistor layer. The first transparent conductive layer covers the transistor layer at a display area, the second transparent conductive layer includes a pattern of touch electrodes, and the third transparent conductive layer includes a pattern of pixel electrodes. Within any pixel area of the display area, the pixel electrode is connected to a pixel electrode connection end of the transistor layer through a via-hole in the first insulation layer and the second insulation layer, and the first transparent conductive layer is provided with an opening at a position corresponding to the via-hole.

16 Claims, 2 Drawing Sheets

(51) Int. Cl.
G02F 1/1333 (2006.01)
H01L 27/12 (2006.01)
G02F 1/1362 (2006.01)
G06F 3/044 (2006.01)

(52) U.S. Cl.
CPC .. *G02F 1/136213* (2013.01); *G02F 1/136227* (2013.01); *G06F 3/044* (2013.01); *G06F 3/0412* (2013.01); *G06F 3/0416* (2013.01); *G09G 3/3648* (2013.01); *G09G 3/3659* (2013.01); *H01L 27/124* (2013.01); *H01L 27/1248* (2013.01); *H01L 27/1255* (2013.01); *H01L 27/1259* (2013.01); *G06F 2203/04103* (2013.01); *G06F 2203/04107* (2013.01); *G06F 2203/04111* (2013.01); *G09G 2300/0408* (2013.01); *G09G 2300/0426* (2013.01); *G09G 2300/0842* (2013.01); *G09G 2300/0876* (2013.01); *G09G 2320/02* (2013.01); *G09G 2354/00* (2013.01)

(58) Field of Classification Search
CPC . G06F 2203/04107; G06F 2203/04111; G06F 3/0412; G06F 3/0416; G06F 3/0418; G06F 3/044; G06F 2203/04103; G09G 2300/0408; G09G 2300/0426; G09G 2300/0842; G09G 2300/0876; G09G 2320/02; G09G 2354/00; G09G 3/3648; G09G 3/3659; H01L 27/124; H01L 27/1248; H01L 27/1255; H01L 27/1259
See application file for complete search history.

(56) References Cited

U.S. PATENT DOCUMENTS

| | | | | |
|---|---|---|---|---|
| 9,075,463 B2* | 7/2015 | Pyo | ............................ | G09G 3/00 |
| 9,182,643 B1* | 11/2015 | Ge | ............................ | G02F 1/1368 |
| 9,190,422 B2* | 11/2015 | Hong | .................... | H01L 27/124 |
| 9,214,480 B2* | 12/2015 | Park | ...................... | H01L 27/124 |
| 9,218,085 B2* | 12/2015 | Hwang | .................. | G06F 3/044 |
| 9,235,297 B2* | 1/2016 | Liu | ........................ | G06F 3/0412 |
| 9,285,933 B2* | 3/2016 | Kim | .......................... | G09G 3/20 |
| 9,292,139 B2* | 3/2016 | Wang | .................... | G06F 3/0412 |
| 9,442,330 B2* | 9/2016 | Huo | .................... | G02F 1/13338 |
| 9,519,387 B2* | 12/2016 | Kim | ........................ | G06F 3/044 |
| 9,535,544 B2* | 1/2017 | Yousefpor | ................ | G06F 3/044 |
| 9,703,425 B2* | 7/2017 | Lee | ........................ | G06F 3/0418 |
| 9,772,708 B2* | 9/2017 | Kim | ....................... | G06F 3/0412 |
| 9,785,276 B2* | 10/2017 | Wei | .......................... | G06F 3/044 |
| 9,921,673 B2* | 3/2018 | Li | ....................... | G02F 1/133345 |
| 10,025,130 B2* | 7/2018 | Kim | ................... | G02F 1/13338 |
| 10,162,450 B2* | 12/2018 | Lu | ......................... | G06F 3/0416 |
| 10,203,795 B2* | 2/2019 | Liu | ........................ | G06F 3/0416 |
| 10,209,812 B2* | 2/2019 | Yang | ....................... | G06F 3/044 |
| 2009/0135158 A1* | 5/2009 | Takahashi | ............ | G06F 3/0416 345/174 |
| 2011/0074728 A1* | 3/2011 | Liu | ........................ | G06F 3/0412 345/174 |
| 2013/0155059 A1* | 6/2013 | Wang | ...................... | G06F 3/041 345/419 |
| 2013/0162595 A1* | 6/2013 | Lee | ........................ | G06F 3/0418 345/174 |
| 2013/0257774 A1* | 10/2013 | Kim | .................... | H01L 27/1259 345/173 |
| 2013/0342479 A1* | 12/2013 | Pyo | ........................... | G09G 3/00 345/173 |
| 2014/0043281 A1* | 2/2014 | Kim | ....................... | G06F 3/044 345/174 |
| 2014/0062944 A1* | 3/2014 | Wang | .................... | G06F 3/0412 345/174 |
| 2014/0176484 A1* | 6/2014 | Tsai | ........................ | G06F 3/044 345/174 |
| 2014/0197413 A1 | 7/2014 | Liu et al. | | |
| 2014/0240279 A1* | 8/2014 | Hwang | ................ | G06F 3/0412 345/174 |
| 2014/0333582 A1* | 11/2014 | Huo | .................... | G02F 1/13338 345/174 |
| 2014/0354586 A1* | 12/2014 | Yousefpor | ............... | G06F 3/044 345/174 |
| 2015/0091014 A1* | 4/2015 | Hong | .................... | H01L 27/124 257/72 |
| 2015/0091015 A1* | 4/2015 | Park | ...................... | H01L 27/124 257/72 |
| 2015/0097802 A1* | 4/2015 | Kim | ....................... | G06F 3/044 345/174 |
| 2015/0317023 A1* | 11/2015 | Wei | ......................... | G06F 3/044 345/174 |
| 2015/0346528 A1* | 12/2015 | Ge | ........................ | G02F 1/1368 349/39 |
| 2016/0048267 A1* | 2/2016 | Lee | ........................ | G06F 3/0418 345/173 |
| 2016/0103547 A1* | 4/2016 | Lu | ......................... | G06F 3/0416 345/174 |
| 2016/0283000 A1* | 9/2016 | Wang | ...................... | G06F 3/041 |
| 2016/0291750 A1* | 10/2016 | Chai | ....................... | G06F 3/044 |
| 2016/0357313 A1* | 12/2016 | Yang | ....................... | G06F 3/044 |
| 2017/0017320 A1* | 1/2017 | Tsai | ........................ | G06F 3/044 |
| 2017/0017327 A1* | 1/2017 | Chang | .................... | G06F 3/0412 |
| 2017/0017340 A1* | 1/2017 | Liu | ........................ | G06F 3/0416 |
| 2017/0084230 A1* | 3/2017 | Lien | ........................ | G09G 3/344 |
| 2017/0176797 A1* | 6/2017 | Kim | ................... | G02F 1/13338 |
| 2017/0177125 A1* | 6/2017 | Kim | ....................... | G06F 3/0412 |
| 2017/0185221 A1* | 6/2017 | Takeuchi | ............. | G06F 3/0412 |
| 2017/0205953 A1* | 7/2017 | Sun | ...................... | G09G 3/3648 |
| 2017/0242536 A1* | 8/2017 | Wang | ...................... | G06F 3/0416 |
| 2017/0255308 A1* | 9/2017 | Li | ....................... | G02F 1/133345 |
| 2018/0143711 A1* | 5/2018 | Ono | ........................ | G06F 3/044 |

FOREIGN PATENT DOCUMENTS

| | | |
|---|---|---|
| CN | 104516140 A | 4/2015 |
| CN | 104516165 A | 4/2015 |

OTHER PUBLICATIONS

Second Chinese Office Action regarding Application No. 201610025575.8 dated Jan. 9, 2019. Translation provided by Dragon Intellectual Property Law Firm.

* cited by examiner

ARRAY SUBSTRATE, ITS DRIVING METHOD AND MANUFACTURING METHOD, AND DISPLAY DEVICE

CROSS-REFERENCE TO RELATED APPLICATION

The present application claims a priority of the Chinese patent application No. 201610025575.8 filed on Jan. 14, 2016, which is incorporated herein by reference in its entirety.

TECHNICAL FIELD

The present disclosure relates to the field of display technology, in particular to an array substrate, its driving method and manufacturing method, and a display device.

BACKGROUND

For an In-cell touch panel in related art, usually a common electrode made of indium tin oxide (ITO) both serves as an electrode of a capacitor for driving liquid crystals and serves as a part of a touch sensor, and it may be divided into block-like or bar-like portions so as to be adapted to the layout of a touch sensing circuit. However, the common electrode formed as an entire layer is originally used to shield electric field generated by a thin film transistor (TFT) circuit thereunder, and a gap between the divided portions of the common electrode may result in an increase in the noise interference of the TFT circuit with respect to a liquid crystal layer and a touch electrode, thereby various display and touch defects may occur.

SUMMARY

An object of the present disclosure is to provide an array substrate, its driving method and manufacturing method, and a display device, so as to enable a common electrode to shield an electric field in the case of an in-cell touch function.

In one aspect, the present disclosure provides in some embodiments an array substrate, including a transistor layer arranged on a base, and a first transparent conductive layer, a first insulation layer, a second transparent conductive layer, a second insulation layer and a third transparent conductive layer sequentially arranged on the transistor layer. The first transparent conductive layer covers the transistor layer at a display area, the second transparent conductive layer includes a pattern of touch electrodes, and the third transparent conductive layer includes a pattern of pixel electrodes. Within any pixel area of the display area, the pixel electrode is connected to a pixel electrode connection end of the transistor layer through via-holes in the first insulation layer and the second insulation layer, and the first transparent conductive layer is provided with an opening at a position corresponding to the via-holes.

Alternatively, within any pixel area of the display area, the pixel electrode overlaps the first transparent conductive layer to form a first storage capacitor at the pixel area, and the pixel electrode overlaps the touch electrode to form a second storage capacitor at the pixel area.

Alternatively, the transistor layer includes an active layer, a gate insulation layer, a gate metal layer, an interlayer medium layer, a source-drain metal layer and a passivation layer formed sequentially, and within any pixel area of the display area, the passivation layer is provided with an opening so as to expose a portion of the source-drain metal layer, thereby to form the pixel electrode connection end.

Alternatively, the first transparent conductive layer, the first insulation layer, the second transparent conductive layer, the second insulation layer and the third transparent conductive layer are arranged sequentially on the transistor layer.

Alternatively, the first transparent conductive layer and the second transparent conductive layer are each arranged at an area surrounding the corresponding via-hole and separated from the corresponding via-hole.

Alternatively, the gate insulation layer and the interlayer medium layer are each provided with a via-hole through which the source-drain metal layer is connected to the active layer.

Alternatively, the first transparent conductive layer, the first insulation layer, the second transparent conductive layer, the second insulation layer and the third transparent conductive layer are each of a thickness within a range from 100 Å to 5000 Å.

In another aspect, the present disclosure provides in some embodiments a method for driving the above-mentioned array substrate, including steps of: at a display stage, applying the common voltage to the touch electrode in the second transparent conductive layer and to the first transparent conductive layer; and at a touch stage, applying the touch voltage signal to the touch electrode in the second transparent conductive layer, or receiving the touch sensing signal from the touch electrode in the second transparent conductive layer. The display stage is temporally separated from the touch stage within each image frame.

Alternatively, the driving method further includes, at the touch stage, applying the common voltage to the first transparent conductive layer.

Alternatively, the driving method further includes, at the touch stage, setting pixel electrodes in a third transparent conductive layer to be in a floating state.

Alternatively, the common voltage is of a value within a range from −5V to +5V.

In yet another aspect, the present disclosure provides in some embodiments a method for manufacturing an array substrate, including steps of: forming a first transparent conductive layer covering a transistor layer at a display area, the first transparent conductive layer being provided with an opening at a position corresponding to via-holes for connecting a pixel electrode connection end of the transistor layer; forming a first insulation layer covering the first transparent conductive layer; forming on the first insulation layer a second transparent conductive layer including a pattern of a touch electrode; forming a second insulation layer covering the second transparent conductive layer and the first insulation layer; forming the via-holes in the first insulation layer and the second insulation layer; and forming a third transparent conductive layer including a pattern of a pixel electrode. Within any pixel area of the display area, the pixel electrode is connected to the pixel electrode connection end of the transistor layer through the via-holes.

Alternatively, within any pixel area of the display area, the pixel electrode overlaps the first transparent conductive layer to form a first storage capacitor at the pixel area, and the pixel electrode overlaps the touch electrode to form a second storage capacitor at the pixel area.

Alternatively, prior to the step of forming the first transparent conductive layer covering the transistor layer at the display area, the manufacturing method further includes forming the transistor layer on a base.

Alternatively, the step of forming the transistor layer on the base includes sequentially forming an active layer, a gate insulation layer, a gate metal layer, an interlayer medium layer, a source-drain metal layer and a passivation layer. Within any pixel area of the display area, the passivation layer is provided with an opening so as to expose a portion of the source-drain metal layer, thereby to form the pixel electrode connection end.

In still yet another aspect, the present disclosure provides in some embodiments a display device including the above-mentioned array substrate.

According to the embodiments of the present disclosure, through the three transparent conductive layers, the touch electrodes in the second transparent conductive layer may serve as the common electrode during a display operation, and the plate-like first transparent conductive layer may serve as a shielding layer during a touch operation, so as to enable a common electrode to shield an electric field in the case of an in-cell touch function. Further, as compared with the related art, it is able for the array substrate in the embodiments of the present disclosure to reduce various display defects and touch defects due to the interference from a TFT circuit, thereby to improve the yield and the performance of the product.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
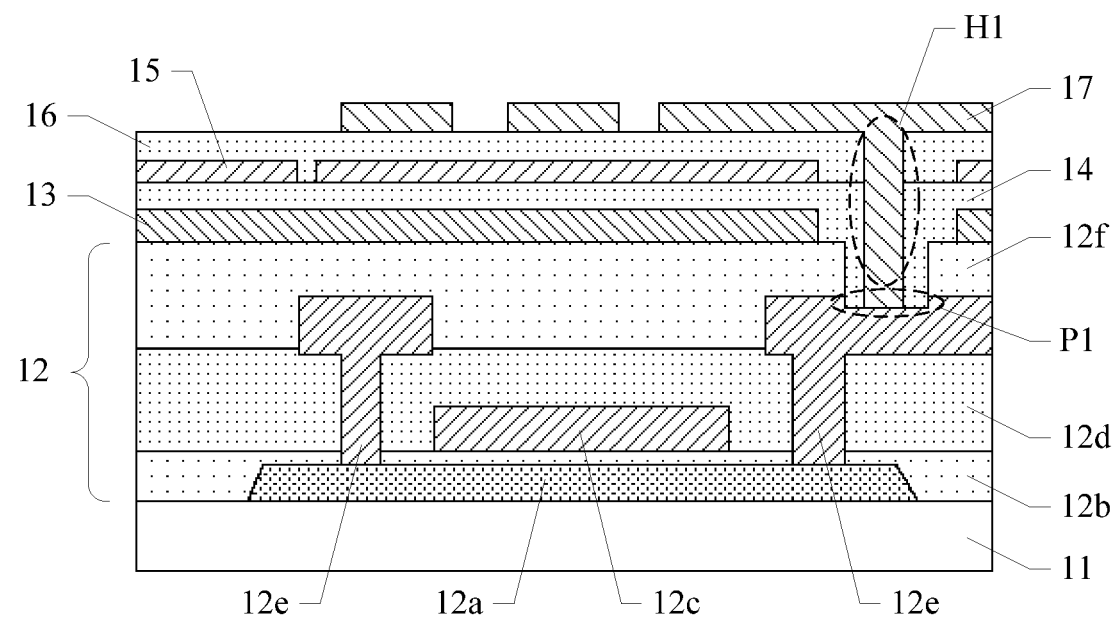
FIG. 1 is a topical sectional view of an array substrate according to at least one embodiment of the present disclosure.

Referring to FIG. 1, which is a topical sectional view of an array substrate according to at least one embodiment of the present disclosure, the array substrate includes a transistor layer 12 arranged on a base 11, and a first transparent conductive layer 13, a first insulation layer 14, a second transparent conductive layer 15, a second insulation layer 16 and a third transparent conductive layer 17 sequentially arranged on the transistor layer 12. The base 11 may be of a plate-like structure made of a material such as glass or polyimide, and it is mainly used to form thereon, and support, any other desired structures. The transistor layer 12 is mainly used to, under the effect of an external signal, provide a data voltage signal to a pixel electrode, and it may include several transistors (e.g., TFTs) which are connected to each other in a certain manner. In addition, the first transparent conductive layer 13, the second transparent conductive layer 15 and the third transparent conductive layer 17 are each made of a transparent conductive material, and may each have at least one pattern through a patterning process. To be specific, the second transparent conductive layer 15 includes a pattern of a touch electrode (e.g., in a capacitive touch mode, the touch electrode may be one of two linear electrodes extending in two directions crossing each other), and the third transparent conductive electrode 17 includes a pattern of a pixel electrode (e.g., in an In-Plane Switching (IPS) mode, a bar-like electrode may be arranged in each pixel area). It should be appreciated that, the first insulation layer 14 is arranged between the first transparent conductive layer 13 and the second transparent conductive layer 15, and it is made of a material having an electrically insulating characteristic so as to electrically insulate the first transparent conductive layer 13 from the second transparent conductive layer 15. The second insulation layer 16 is arranged between the second transparent conductive layer 15 and the third transparent conductive layer 17, and it is made of a material having an electrically insulating characteristic so as to electrically insulate the second transparent conductive layer 15 from the third transparent conductive layer 17.

Although not shown in FIG. 1, the array substrate for a display device may include, on a main plane, a display area (where a plurality of pixel areas is arranged, i.e., an Active Area (AA)) and a non-display area (an area beyond the display area). Usually, the display area is of a closed boundary, and the non-display area surrounds the display area. In some embodiments of the present disclosure, the first transparent conductive layer 13 covers the transistor layer 12 at the display area of the array substrate. Within any pixel area of the display area, the pixel electrode in the third transparent conductive layer 17 is connected to a pixel electrode connection end P1 of the transistor layer 12 through a via-hole H1 in the first insulation layer 14 and the second insulation layer 16, meanwhile the first transparent conductive layer 13 is provided with an opening at a position corresponding to the via-hole H1, so as to be electrically insulated from the third transparent conductive layer 17. It should be appreciated that, the transistor layer 12 is provided with an opening for connecting the pixel electrode (i.e., the pixel electrode connection end P1), and the first insulation layer 14 and the second insulation layer 16 are also provided with the via-hole H1 through which the pixel electrodes in the third transparent conductive layer 17 is connected to the pixel electrode connection end P1. In addition, the first transparent conductive layer 13 and the second transparent conductive layer 15 are not provided at the positions corresponding to the via-hole H1, so an electric signal from the pixel electrode connection end P1 of the transistor layer 12 may merely be applied to the pixel electrode at the corresponding pixel area, rather than to any pattern in the first transparent conductive layer 13 or the second transparent conductive layer 15.

Based on the above-mentioned structure, the array substrate in the embodiments of the present disclosure may be used for In-Cell touch display. To be specific, each image frame may be temporally divided into a touch stage and a display stage. At the display stage, a common voltage (Vcom) may be applied to the pattern of the touch electrode in the second transparent conductive layer 15, and the first transparent conductive layer 13 covering the transistor layer 12 at the display area may serve as a common electrode. In this way, under the effect of an external signal, the transistor layer 12 may apply a data voltage signal to the pixel electrode at each pixel area, so as to generate electric fields between the pixel electrode and the touch electrode and between the pixel electrode and the common electrode. The electric fields drive liquid crystal molecules to deflect, thereby to achieve a display operation in an IPS mode. At the touch stage, no signal may be applied to the pixel electrode, so as to achieve a touch sensing operation in a capacitive touch mode through the cooperation of the touch electrode and another touch electrode arranged above the pixel electrode. At the touch stage, the common voltage may be (or may not be) applied to the first transparent conductive layer 13 covering the transistor layer 12 at the display area, so as to prevent the mutual interference between electric fields, including the interference caused by an electric field generated by the transistor layer 12 to the touch electrode, and the interference caused by an electric field generated by the touch electrode to the transistor layer 12.

According to the embodiments of the present disclosure, through the three transparent conductive layers, the touch electrodes in the second transparent conductive layer may serve as the common electrode during a display operation, and the plate-like first transparent conductive layer may serve as a shielding layer during a touch operation, so as to enable a common electrode to shield an electric field in the case of an in-cell touch function. Further, as compared with the related art, it is able for the array substrate in the embodiments of the present disclosure to reduce various display defects and touch defects due to the interference from a TFT circuit, thereby to improve the yield and the performance of the product.

It should be appreciated that, FIG. 1 merely shows a portion of the array substrate at one of the pixel areas of the display region, and the structure of the transistor layer 12 is merely for illustrative purpose. To be specific, FIG. 1 is a sectional view of a top-gate TFT in the transistor layer 12, and at this time, the transistor layer 12 includes an active layer 12a, a gate insulation layer 12b, a gate metal layer 12c, an interlayer medium layer 12d, a source-drain metal layer 12e and a passivation layer 12f formed sequentially. Within any pixel area of the display area, the passivation layer 12f is provided with an opening so as to expose a portion of the source-drain metal layer 12e, thereby to form the pixel electrode connection end P1. In addition, the via-hole is formed in the gate insulation layer 12b and the interlayer medium layer 12d, and the source-drain metal layer 12e is connected to the active layer 12a through the via-hole. It should be appreciated that, the source-drain metal layer made of a conductive material is in contact with the active layer 12a made of a semiconductive material at different positions, so as to form a source electrode and a drain electrode of the TFT. The gate metal layer 12c made of a conductive material at least partially overlaps the active layer 12a made of the semiconductive material, so as to form a gate electrode of the TFT. The gate insulation layer 12b, the interlayer medium layer 12d and the passivation layer 12f made of an insulating material are mainly used to electrically insulate the conductive layers from each other. Based on the above, a circuit structure having a certain function may be formed in the transistor layer 12 through the TFTs at different positions and the conductive layers, so as to provide the data voltage signal to the pixel electrode under the effect of the external signal. Of course, the TFT in the transistor layer 12 may also be of a bottom-gate type, or any other types. In addition, apart from the TFTs, the transistor layer 12 may further include any other layers for various functions (e.g., for connecting, insulating, light-shielding or electric-shielding functions), which will not be particularly defined herein.

Figure 2:
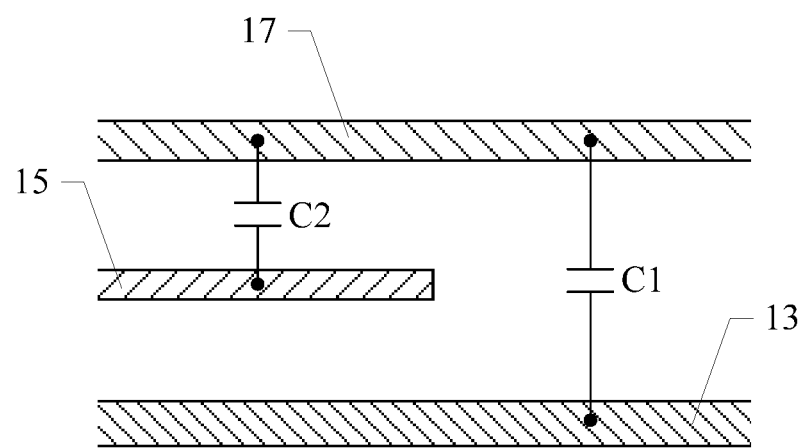
FIG. 2 is a schematic view showing a storage capacitor within a pixel area according to at least one embodiment of the present disclosure.

Referring to FIG. 2, which is a schematic view showing a storage capacitor at a pixel area according to at least one embodiment of the present disclosure, wherein within any pixel area of the display area, the pixel electrode in the third transparent conductive layer 17 overlaps the first transparent conductive layer 13 to form a first storage capacitor C1 at the pixel area, and the pixel electrode overlaps the touch electrode in the second transparent conductive layer 15 to form a second storage capacitor C2 at the pixel area. It should be appreciated that, the first storage capacitor C1 and the second storage capacitor C2 are formed due to the overlapping between the conductive layers, and the symbols in FIG. 1 are merely used for illustrative purpose but do not represent any additional capacitors. It should be further appreciated that, the first storage capacitor C1 and the second storage capacitor C2 are also formed due to the voltages applied at the display stage, i.e., the data voltage signal applied to the pixel electrode and the common voltage applied to the touch electrode and the common electrode. Hence, at the display stage, the storage capacitor at each pixel area may be considered as a capacitor obtained by connecting the first storage capacitor C1 and the second storage capacitor C2 in parallel (i.e., a total storage capacitance is a sum of capacitances of the two storage capacitors). In design, the relevant parameters of the multi-layer structure consisting of the pixel electrode, the touch electrode and the common electrode may be taken into consideration, so as to acquire the desired total storage capacitance. According to the formula for calculating a capacitance of a parallel-plate capacitor, the touch electrode in the embodiments of the present disclosure may provide a larger capacitance as compared with a common electrode arranged separately (because the touch electrode is arranged closer to the pixel electrode than the common electrode). In this way, it is able for the pixel area with an identical size to provide a larger total storage capacitance, or to reduce the size of the pixel area in the case of a constant storage capacitance. In other words, through the three transparent conductive layers, it is also able to increase the storage capacitance to improve the performance of the capacitor, and/or reduce the size of the pixel area to increase Pixels Per Inch (PPI), thereby to improve the display performance.

Figure 3:
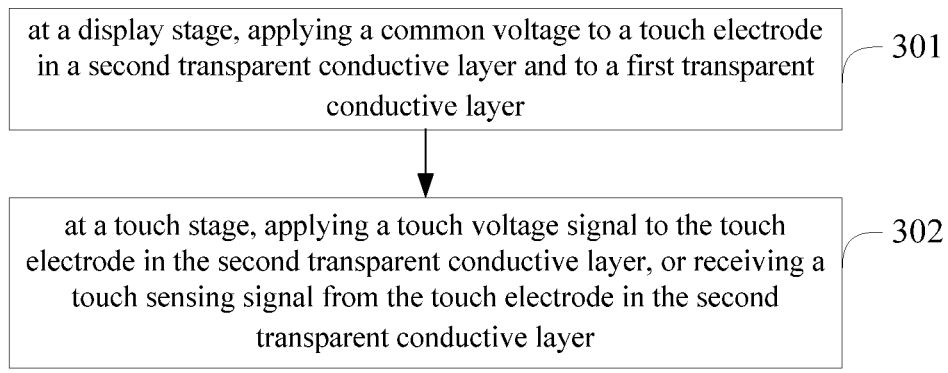
FIG. 3 is a flow chart of a method for driving an array substrate according to at least one embodiment of the present disclosure.

Referring to FIG. 3, which is a flow chart of a method for driving the above array substrate according to at least one embodiment of the present disclosure, the driving method includes Step 301 of, at a display stage, applying a common voltage to touch electrodes in a second transparent conductive layer and to a first transparent conductive layer, and Step 302 of, at a touch stage, applying a touch voltage signal to the touch electrode in the second transparent conductive layer, or receiving a touch sensing signal from the touch electrode in the second transparent conductive layer. The display stage is temporally separated from the touch stage within each image frame.

It should be appreciated that, an order of Step 301 and Step 302 may be determined in accordance with an order of the display stage and the touch stage within each image frame, and the order of the display stage and the touch stage may be set in accordance with the practical needs in different scenarios, which will not be particularly defined herein. In addition, the voltages applied to the touch electrode and the first transparent conductive layer may be adjusted in accordance with the practical need, e.g., they may be each of a value within the range of −5V to +5V.

It should be appreciated that, the driving method in the embodiments of the present disclosure may be performed on the basis of the structure of the above-mentioned array substrate, and applied to any peripheral circuit connected to the transistor layer (e.g., a time controller TCON, a gate driver, a source driver or a touch circuit). For example, the two kinds of touch electrodes may be connected to the touch circuit, so as to receive a touch voltage signal from the touch circuit and/or send a touch sensing signal to the touch circuit. Through the driving method in combination with the above-mentioned array substrate, it is able to achieve the in-cell touch display, and enable the common electrode to shield the electric field.

In addition, at the touch stage, the common voltage may be applied to the first transparent conductive layer, so as to enable the first transparent conductive layer to prevent the mutual interference between the electric signals in a better manner. In addition, at the touch stage, the pixel electrode in the third transparent conductive layer may also be set to be in a floating state, so as to reduce the interference to the touch electrode. Of course, the above arrangement may be adopted in accordance with the practical need, and it will not be particularly defined herein.

Figure 4:
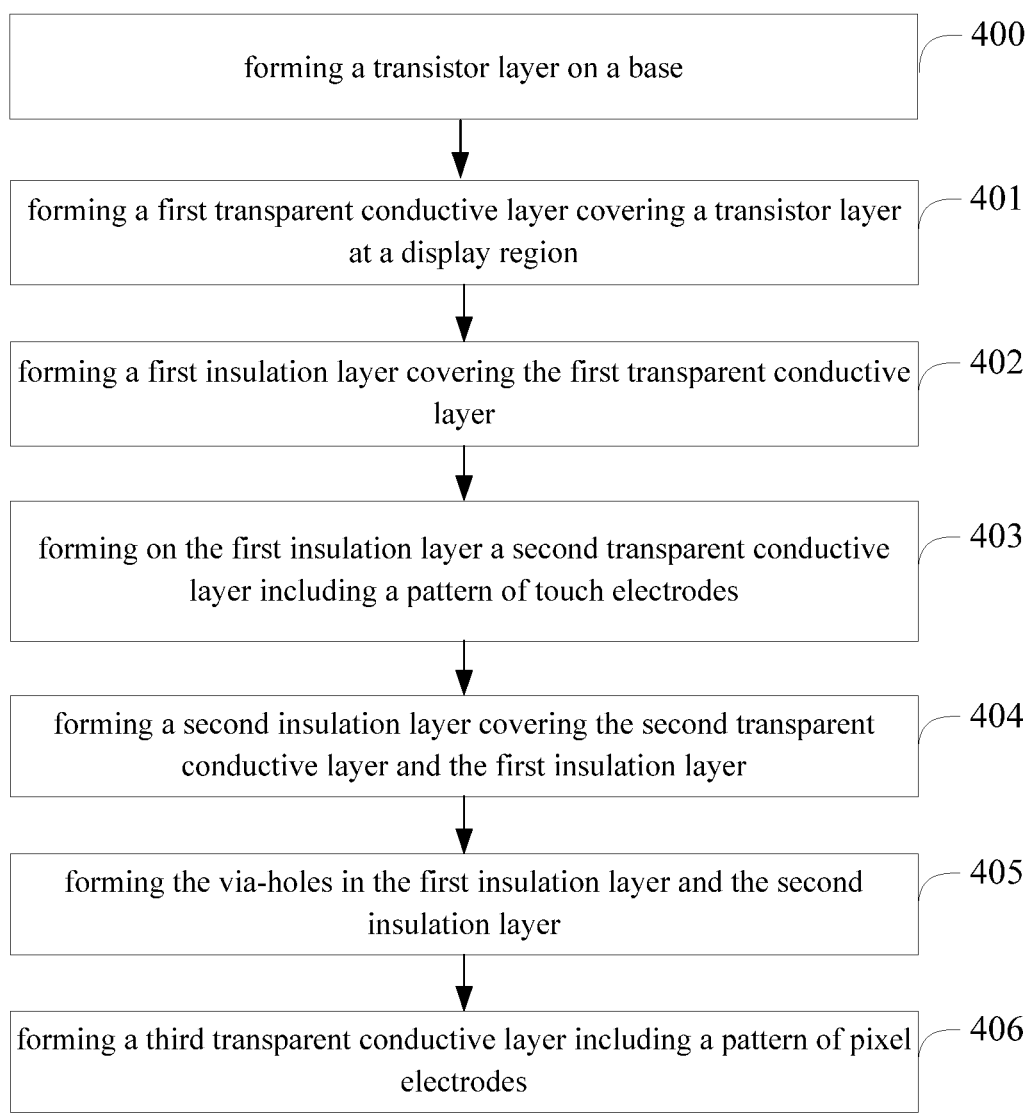
FIG. 4 is a flow chart of a method for manufacturing an array substrate according to at least one embodiment of the present disclosure.

Referring to FIG. 4, which is a flow chart of a method for manufacturing an array substrate according to at least one embodiment of the present disclosure, the manufacturing method includes: Step 400 of forming a transistor layer on a base; Step 401 of forming a first transparent conductive layer covering a transistor layer at a display region, the first transparent conductive layer being provided with an opening at a position corresponding to the via-hole for connecting a pixel electrode connection end of the transistor layer; Step 402 of forming a first insulation layer covering the first transparent conductive layer; Step 403 of forming on the first insulation layer a second transparent conductive layer including a pattern of touch electrodes; Step 404 of forming a second insulation layer covering the second transparent conductive layer and the first insulation layer; Step 405 of forming the via-hole in the first insulation layer and the second insulation layer; and Step 406 of forming a third transparent conductive layer including a pattern of the pixel electrodes. Within any pixel region of the display region, the pixel electrode is connected to the pixel electrode connection end of the transistor layer through the via-hole.

It should be appreciated that, the manufacturing method may be used to form any of the above-mentioned array substrates. For example, prior to Step 401, the transistor layer has been formed on the base. In addition, in one or more of Steps 401, 403 and 406, the transparent conductive layer may be provided with corresponding ITO patterns through a single ITO patterning process. In Steps 402 and 404, a surface passivation process may be adopted so as to form the first insulation layer or the second insulation layer on the entire first or second transparent conductive layer. In Step 405, the first insulation layer and the second insulation layer may be partially etched through a single patterning process, so as to form the via-hole. Further, thickness of the transparent conductive layers and the insulation layer may be set in accordance with the practical need, e.g., within the range from 100 Å to 5000 Å.

In an alternative embodiment, on the basis of the structure of the transistor layer 12 in FIG. 1, Step 400 of forming the transistor layer on the base may include sequentially forming an active layer, a gate insulation layer, a gate metal layer, an interlayer medium layer, a source-drain metal layer and a passivation layer. Within any pixel region of the display region, the passivation layer is provided with an opening so as to expose a portion of the source-drain metal layer, thereby to form the pixel electrode connection end. It should be appreciated that, the structure of the transistor layer may refer to that mentioned above, and the layers of the transistor layer may be formed by a patterning process or a surface passivation process. A circuit structure having a certain function may be formed in the transistor layer on the basis of the TFTs at different positions and the conductive layers, so as to provide the data voltage signal to the pixel electrode under the effect of the external signal. Of course, the TFT in the transistor layer may be of a bottom-gate type or any other types, and apart from the TFTs, the transistor layer may include any other layers for achieves the other functions (e.g., connecting, insulating, light shielding and electric shielding functions), which will not be particularly defined herein.

Based on an identical inventive concept, the present disclosure further provides in some embodiments a display device including the above-mentioned array substrate. The display device may be any product or member having a display function, such as a liquid crystal panel, an electronic paper, a mobile phone, a flat-panel computer, a television, a laptop computer, a digital photo frame or a navigator. In particular, the display device may be a liquid crystal device with an Advanced Super Dimension Switch (ADS) mode. According to the display device in the embodiments of the present disclosure, through the three transparent conductive layers, the touch electrodes in the second transparent conductive layer may serve as the common electrode during a display operation, and the plate-like first transparent conductive layer may serve as a shielding layer during a touch operation, so as to enable a common electrode to shield an electric field in the case of an in-cell touch function. Further, as compared with the related art, it is able for the array substrate in the embodiments of the present disclosure to reduce various display defects and touch defects due to the interference from a TFT circuit, thereby to improve the yield and the performance of the product.

It should be appreciated that, in the embodiments of the present disclosure, such words as "first" and "second" are merely used to separate one entity or operation from another entity or operation, but are not necessarily used to represent or imply any relation or order between the entities or operations. Such words as "include", "consist of" and the like have a non-exclusive meaning, i.e., a process, method, article or device including a series of elements may include these elements and any other elements not listed, or any other inherent elements for the process, method, article or device. Unless otherwise defined, for the phrase "including one . . .", it is not excluded that the process, method, article or device may include any other elements, apart from the elements defined in this phrase. Such words as "on" and "under" are used to show, in a convenient and simplified manner, an orientation or position on the basis of the drawings, but shall not be used to indicate or imply that the devices or components must be arranged at the particular position or operated in the particular direction. Unless otherwise specified, such words as "arrange" and "connect" have a general meaning, e.g., the word "connection" may refer to fixed connection, removable connection or integral connection, or mechanical or electrical connection, or direct connection or indirect connection via an intermediate component, or communication between two components. The meanings of these words may be understood by a person skilled in the art in accordance with the context of the description.

It should be appreciated that, although with a large number of details, these specific details are not necessary for the implementation of the present disclosure. In some embodiments of the present disclosure, the known method, structure or technology is not shown, so as to facilitate the understanding of the present disclosure in a better manner. It should be further appreciated that, sometimes the features of the present disclosure are described in conjunction with a single embodiment or figure, so as to facilitate the understanding of one or more aspects of the present disclosure.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising:
   a transistor layer arranged on a base;
   a first transparent conductive layer;
   a first insulation layer;
   a second transparent conductive layer;
   a second insulation layer; and
   a third transparent conductive layer,
   wherein:
   the first transparent conductive layer, the first insulation layer, the second transparent conductive layer, the second insulation layer, and the third transparent conductive layer are arranged sequentially, in that order, on the transistor layer,
   the first transparent conductive layer covers the transistor layer at a display area, the first transparent conductive layer is configured to be a first common electrode at a display stage by applying a common voltage to the first transparent conductive layer at the display stage, and configured to be a shielding layer at a touch stage, the second transparent conductive layer comprises a pattern of touch electrodes, the second transparent conductive layer is in direct physical contact with the second insulation layer and the first insulation layer, the touch electrodes are configured to be a second common electrode of the array substrate at the display stage by applying the common voltage to the touch electrodes at the display stage, and the third transparent conductive layer comprises a pattern of pixel electrodes; and
   within any one of pixel areas of the display area,
   a corresponding pixel electrode is connected to a pixel electrode connection end on a source-drain metal layer of the transistor layer through a via-hole in the first insulation layer and the second insulation layer, and the via-hole is arranged between a pattern of the corresponding pixel electrode and the source-drain metal layer,
   a passivation layer of the transistor layer is provided with a second opening so as to expose a portion of the source-drain metal layer, thereby to form the pixel electrode connection end,
   the first transparent conductive layer is provided with a first opening at a position corresponding to the via-hole.

2. The array substrate according to claim 1, wherein within any one of the pixel areas of the display area, the pixel electrode overlaps the first transparent conductive layer to form a first storage capacitor at the pixel area, and the pixel electrode overlaps a corresponding touch electrode to form a second storage capacitor at the pixel area.

3. The array substrate according to claim 1, wherein the transistor layer comprises an active layer, a gate insulation layer, a gate metal layer, an interlayer medium layer, the source-drain metal layer and the passivation layer formed seguentially.

4. The array substrate according to claim 1, wherein the first transparent conductive layer and the second transparent conductive layer are each arranged at an area outside an area of the via-hole, and separated from the via-hole.

5. The array substrate according to claim 3, wherein the gate insulation layer and the interlayer medium layer are provided with another via-hole through which the source-drain metal layer is connected to the active layer.

6. The array substrate according to claim 1, wherein the first transparent conductive layer, the first insulation layer, the second transparent conductive layer, the second insulation layer and the third transparent conductive layer are each of a thickness within a range from 100 Å to 5000 Å.

7. A display device, comprising the array substrate according to claim 1.

8. The display device according to claim 7, wherein within any one of pixel areas of the display area, the pixel electrode overlaps the first transparent conductive layer to form a first storage capacitor at the pixel area, and the pixel electrode overlaps a corresponding touch electrode to form a second storage capacitor at the pixel area.

9. The display device according to claim 7, wherein the transistor layer comprises an active layer, a gate insulation layer, a gate metal layer, an interlayer medium layer, the source-drain metal layer and the passivation layer formed sequentially.

10. A method for driving an array substrate, wherein the array substrate comprises:
   a transistor layer arranged on a base;
   a first transparent conductive layer;
   a first insulation layer;
   a second transparent conductive layer;
   a second insulation layer; and
   a third transparent conductive layer, wherein:
   the first transparent conductive layer, the first insulation layer, the second transparent conductive layer, the second insulation layer, and the third transparent conductive layer are arranged sequentially, in that order, on the transistor layer,
   the first transparent conductive layer covers the transistor layer at a display area, the first transparent conductive layer is configured to be a first common electrode at a display stage by applying a common voltage to the first transparent conductive layer at the display stage, and configured to be a shielding layer at a touch stage, the second transparent conductive layer comprises a pattern of touch electrodes, the second transparent conductive layer is in direct physical contact with the second insulation layer and the first insulation layer, the touch electrodes are configured to be a second common electrode of the array substrate at the display stage by applying the common voltage to the touch electrodes at the display stage, and the third transparent conductive layer comprises a pattern of pixel electrodes; and
   within any one of pixel areas of the display area, a corresponding pixel electrode is connected to a pixel electrode connection end on a source-drain metal layer of the transistor layer through a via-hole in the first insulation layer and the second insulation layer, and the via-hole is arranged between a pattern of the corresponding pixel electrode and the source-drain metal layer, a passivation layer of the transistor layer is provided with a second opening so as to expose a portion of the source-drain metal layer, thereby to form the pixel electrode connection end, the first transparent conductive layer is provided with a first opening at a position corresponding to the via-hole, the method comprising the steps of:

at the display stage, applying the common voltage to the touch electrode in the second transparent conductive layer and to the first transparent conductive layer; and at the touch stage, applying a touch voltage signal to the touch electrode in the second transparent conductive layer, or receiving a touch sensing signal from the touch electrode in the second transparent conductive layer, wherein the display stage is temporally separated from the touch stage within each image frame.

11. The method according to claim 10, further comprising:

at the touch stage, applying the common voltage to the first transparent conductive layer.

12. The method according to claim 10, further comprising:

at the touch stage, setting pixel electrodes in the third transparent conductive layer to be in a floating state.

13. The method according to claim 10, wherein the common voltage is of a value within a range from −5V to +5V.

14. A method for manufacturing an array substrate, comprising steps of:

forming a transistor layer on a base of the array substrate;

forming a first transparent conductive layer covering the transistor layer at a display area, and the first transparent conductive layer being provided with a first opening at a position corresponding to a via-hole for connecting a pixel electrode connection end of the transistor layer;

forming a first insulation layer covering the first transparent conductive layer, the first transparent conductive layer being configured to be a first common electrode at a display stage by applying a common voltage to the first transparent conductive layer at the display stage, and configured to be a shielding layer at a touch stage by applying the common voltage to the first transparent conductive layer at the touch stage;

forming on the first insulation layer a second transparent conductive layer including a pattern of touch electrodes, the second transparent conductive layer being in direct physical contact with a second insulation layer and the first insulation layer, and the touch electrodes being configured to be a second common electrode of the array substrate at the display stage by applying the common voltage to the touch electrodes at the display stage;

forming the second insulation layer covering the second transparent conductive layer and the first insulation layer;

forming the via-hole in the first insulation layer and the second insulation layer; and forming a third transparent conductive layer including a pattern of pixel electrodes on the second insulation layer, wherein within any one of pixel areas of the display area, a corresponding pixel electrode is connected to the pixel electrode connection end of the transistor layer through the via-hole, a passivation layer of the transistor layer is provided with a second opening so as to expose a portion of a source-drain metal layer, thereby to form the pixel electrode connection end.

15. The method according to claim 14, wherein within any one of pixel areas of the display area, the pixel electrode overlaps the first transparent conductive layer to form a first storage capacitor at the pixel area, and the pixel electrode overlaps the touch electrode to form a second storage capacitor at the pixel area.

16. The method according to claim 14, wherein the step of forming the transistor layer on the base comprises sequentially forming an active layer, a gate insulation layer, a gate metal layer, an interlayer medium layer, a source-drain metal layer and the passivation layer.

* * * * *

UNITED STATES PATENT AND TRADEMARK OFFICE
CERTIFICATE OF CORRECTION

PATENT NO. : 10,564,772 B2  
APPLICATION NO. : 15/233408  
DATED : February 18, 2020  
INVENTOR(S) : Chaochao Sun et al.

Page 1 of 1

It is certified that error appears in the above-identified patent and that said Letters Patent is hereby corrected as shown below:

On the Title Page

Item (73) reads:
"ORDOS YUANSHENG OPTOELECTRONICS CO., LTD. Beijing, China"
Should read:
--ORDOS YUANSHENG OPTOELECTRONICS CO., LTD. Ordos, China--

Signed and Sealed this  
Fifth Day of January, 2021

Andrei Iancu  
*Director of the United States Patent and Trademark Office*